United States Patent
Yokozeki

(10) Patent No.: US 6,741,505 B2
(45) Date of Patent: May 25, 2004

(54) SEMICONDUCTOR MEMORY DEVICE WITH IMPROVED OPERATION MARGIN AND INCREASING OPERATION SPEED REGARDLESS OF VARIATIONS IN SEMICONDUCTOR MANUFACTURING PROCESSES

(75) Inventor: Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 203 days.

(21) Appl. No.: 10/102,672

(22) Filed: Mar. 22, 2002

(65) Prior Publication Data

US 2003/0063493 A1 Apr. 3, 2003

(30) Foreign Application Priority Data

Sep. 27, 2001 (JP) .......................... 2001-296678

(51) Int. Cl.⁷ ................................. G11C 7/00
(52) U.S. Cl. ................. 365/189.7; 265/189.7; 265/210
(58) Field of Search .............. 365/189.7, 210, 365/203, 207, 208, 174, 189

(56) References Cited

U.S. PATENT DOCUMENTS 4,751,681 A * 6/1988 Hashimoto .............. 365/189.05
5,889,718 A * 3/1999 Kitamoto et al. ........... 365/210

FOREIGN PATENT DOCUMENTS

JP          07-093972          4/1995

* cited by examiner

*Primary Examiner*—David Nelms
*Assistant Examiner*—Thinh T Nguyen
(74) *Attorney, Agent, or Firm*—Arent Fox Kintner Plotkin & Kahn, PLLC

(57) ABSTRACT

A semiconductor memory device has a dummy bit line, a reference voltage generating circuit, a comparator circuit, and a timing signal generating circuit. The dummy bit line has a load equal to a load of a bit line, and the reference voltage generating circuit generates a reference voltage. The comparator circuit compares a potential of the dummy bit line with the reference voltage, and the timing signal generating circuit generates various kinds of timing signals based on an output of the comparator circuit. The semiconductor memory device simultaneously selects a plurality of dummy memory cells and connects the selected dummy memory cells to the dummy bit line, and adjusts the potential of the dummy bit line.

32 Claims, 15 Drawing Sheets

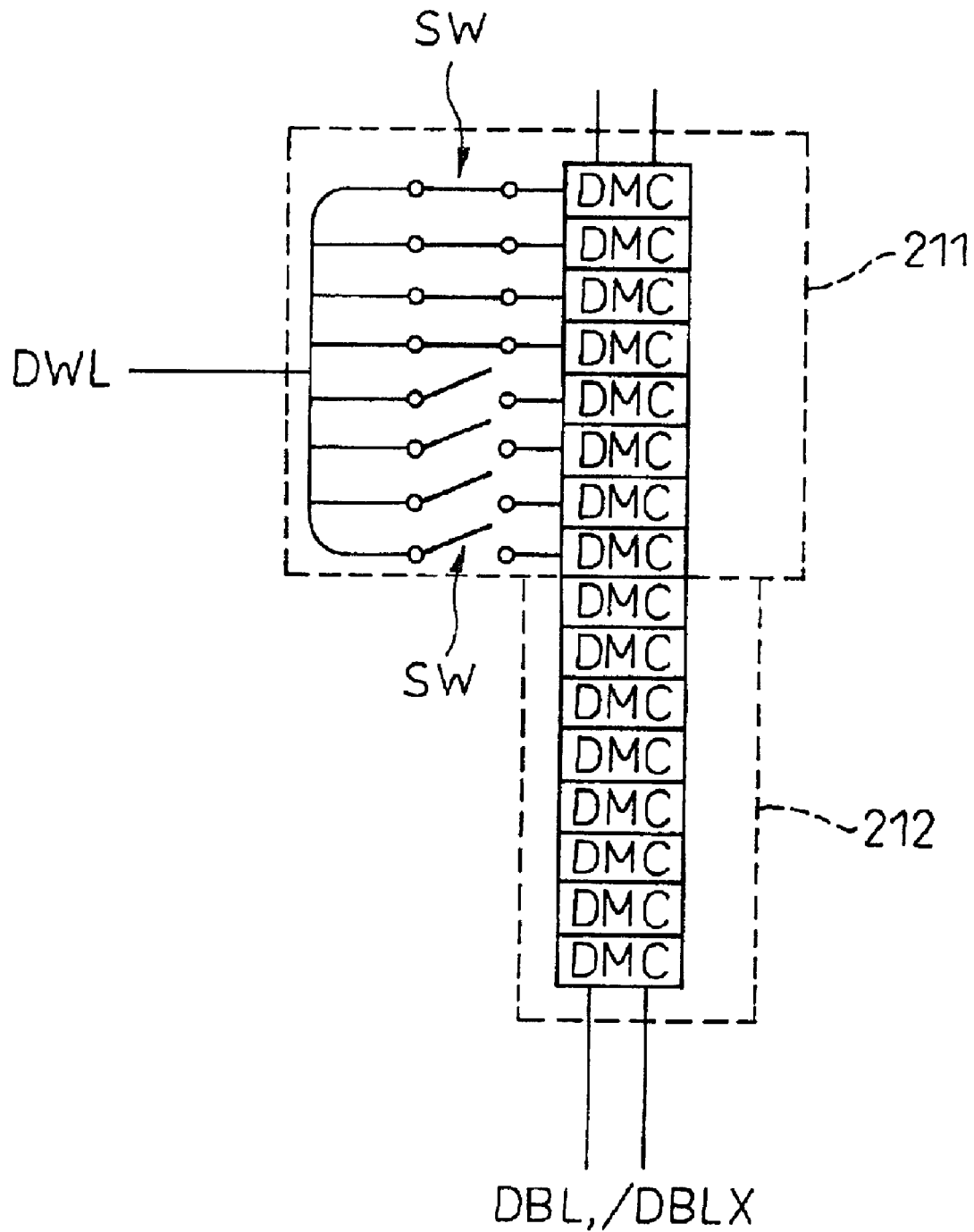

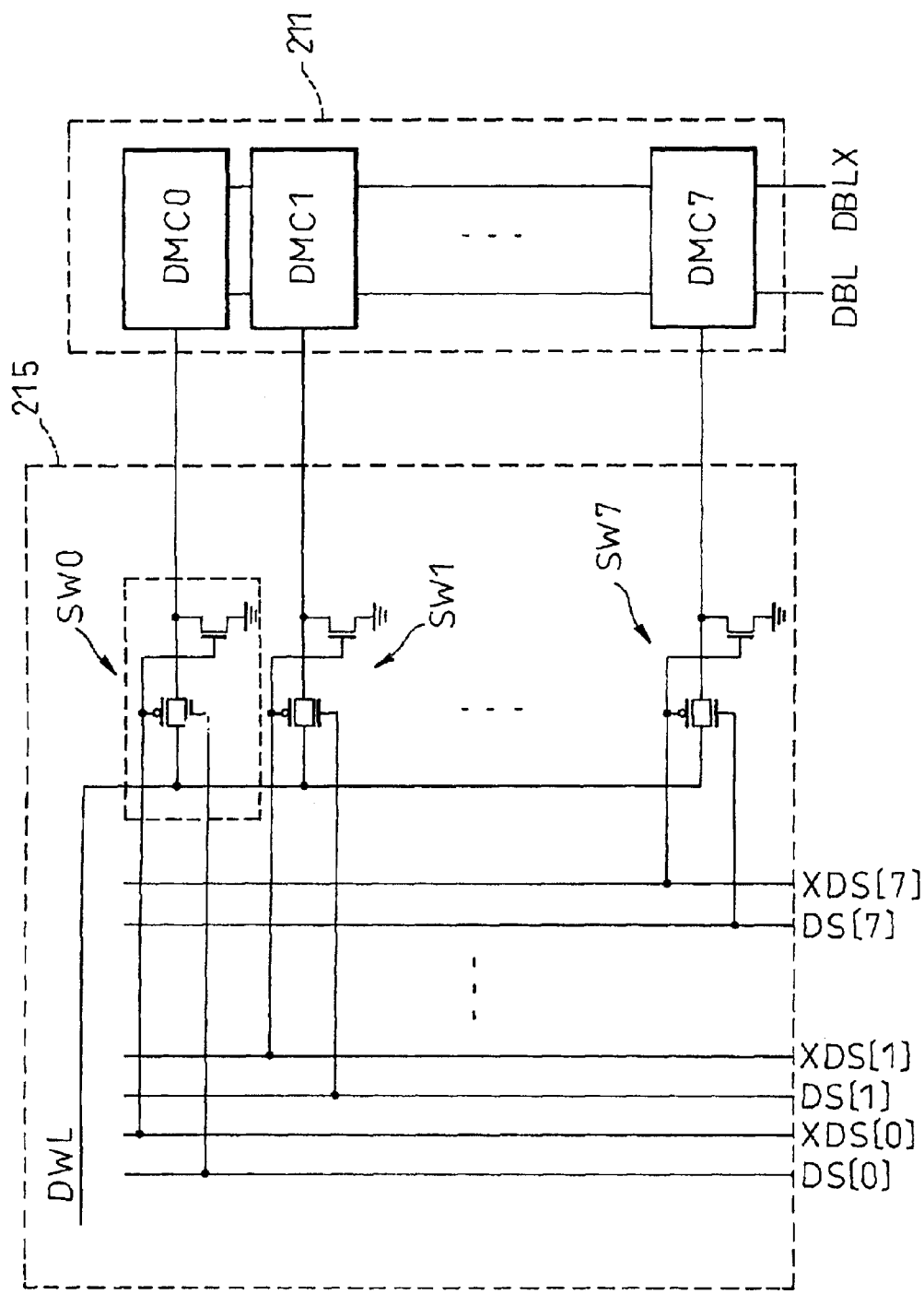

SEMICONDUCTOR MEMORY DEVICE WITH IMPROVED OPERATION MARGIN AND INCREASING OPERATION SPEED REGARDLESS OF VARIATIONS IN SEMICONDUCTOR MANUFACTURING PROCESSES

BACKGROUND OF THE INVENTION

1. Field of the Invention

The present invention relates to a semiconductor memory device. More particularly, the present invention relates to a semiconductor memory device that compares a potential of a dummy bit line with a reference voltage, and generates various kinds of timing signals.

2. Description of the Related Art

Recently, the performance of components used in computers and other information processing apparatuses has been greatly improved. For example, along with an increase in the memory capacity of a semiconductor memory device like an SRAM (Static Random Access Memory) and a DRAM (Dynamic Random Access Memory), the operation speed has been increased and the power consumption of this semiconductor memory device has been reduced. Further, there has been a demand for the provision of semiconductor memory devices that can achieve higher-speed operation regardless of variations in semiconductor manufacturing processes and manufacturing lines.

In a DRAM, various kinds of timing signals are generated by a timing signal generating circuit that is provided within the DRAM. Conventionally, for example, a sense amplifier enabling signal has been generated by adjusting a timing, based on an insertion of a delay circuit that gives a suitable delay time to the timing signal generating circuit. This adjustment has been carried out to generate a sufficient difference in voltage amplitudes in bit lines or data buses, during a period from when a word line signal is activated until when a sense amplifier starting signal is activated. This has been done regardless of variations in the memory cell process.

The delay circuit (which may be formed by a plurality of inverters connected in cascade) provided in the timing signal generating circuit outputs the sense amplifier enabling signal of the sense amplifier after a delay time since the selection of a word line. Nevertheless, in reading the same data that are stored in the memory cells, voltages (voltage amplitudes) between the bit lines are different from each other. This is because of differences in parasitic capacitance at locations of the memory cells in a memory cell array, or variations in semiconductor manufacturing processes and manufacturing lines. Further, an input offset voltage of the sense amplifier also varies depending on the variations in semiconductor manufacturing processes and manufacturing lines, or the temperatures of the environments in which they are used. Therefore, when it is possible to obtain only the input offset that is below the operation margin of the sense amplifier, the sense amplifier cannot correctly read the data.

The prior art and the problems associated with the prior art will be described in detail later with reference to accompanying drawings.

SUMMARY OF THE INVENTION

An object of the present invention is to provide a semiconductor memory device that can substantially improve the operation margin and can further increase the operation speed regardless of variations in semiconductor manufacturing processes and manufacturing lines.

According to the present invention, there is provided a semiconductor memory device comprising a dummy bit line having a load equal to a load of a bit line; a reference voltage generating circuit generating a reference voltage; a comparator circuit comparing a potential of the dummy bit line with the reference voltage; and a timing signal generating circuit generating various kinds of timing signals based on an output of the comparator circuit, wherein the semiconductor memory device simultaneously selects a plurality of dummy memory cells and connects the selected dummy memory cells to the dummy bit line, and adjusts the potential of the dummy bit line.

Further, according to the present invention, there is also provided a semiconductor memory device comprising a memory cell array including a plurality of word lines, a plurality of bit lines, and a plurality of memory cells each provided at an intersection point of the word line and the bit line; a word driver driving a predetermined word line in the memory cell array according to an address signal; a dummy bit line simulating the bit line; a reference voltage generating circuit generating a reference voltage; a comparator circuit comparing a potential of the dummy bit line with the reference voltage; a timing signal generating circuit generating various kinds of timing signals based on an output of the comparator circuit; and a plurality of dummy memory cells being simultaneously connectable to the dummy bit line.

The dummy memory cells may be a plurality of reading dummy memory cells that are driven by a dummy word line. A plurality of load dummy memory cells may be connected to the dummy word line. A plurality of load dummy memory cells may be connected to the dummy bit line. The number of the dummy memory cells that are connected simultaneously may be adjusted in a layout process.

The semiconductor memory device may further comprise a switching circuit controlling the number of dummy memory cells that are connected simultaneously. The semiconductor memory device may further comprise a dummy memory cell selection signal generating circuit generating a dummy memory cell selection signal according to a dummy memory cell selection control signal; and a dummy memory cell selecting circuit selecting a plurality of dummy memory cells that are connected simultaneously according to the dummy memory cell selection signal. The dummy memory cell selecting circuit may be formed as a switch having a reset function.

The comparator circuit may be a current-mirror type differential amplifier. The semiconductor memory device may further comprise a comparator circuit output resetting circuit that resets an output of the comparator circuit when the comparator is inactive. The semiconductor memory device may further comprise a bit-line equalizing circuit that resets potentials of the bit lines and the dummy bit line to a predetermined voltage, wherein the comparator circuit becomes inactive when the bit-line equalizing circuit is active, and the comparator circuit becomes active when the bit-line equalizing circuit is inactive.

The semiconductor memory device may further comprise a dummy load capacitance provided in a wiring route from the bit-line equalizing circuit to the comparator circuit. The semiconductor memory device may further comprise a data bus equalizing circuit resetting potentials of data buses or dummy data buses to a predetermined voltage, wherein the comparator circuit becomes inactive when the data bus equalizing circuit is active, and the comparator circuit becomes active when the data bus equalizing circuit is inactive.

The semiconductor memory device may further comprise a sense amplifier reading a data of a memory cell that is connected to a predetermined word line; and an output latch circuit latching an output of the sense amplifier. The semiconductor memory device may further comprise a dummy sense amplifier provided in a wiring route from the bit-line equalizing circuit to the comparator circuit, and simulating a load of the sense amplifier; and a dummy output latch circuit simulating a load of the output latch circuit. The semiconductor memory device may further comprise a column switch selecting a predetermined bit line from among a plurality of bit lines, and connects the selected bit line to the sense amplifier, wherein the column switch makes the dummy bit line simulate the loads of a plurality of bit lines to be selected.

BRIEF DESCRIPTION OF THE DRAWINGS

The present invention will be more clearly understood from the description of the preferred embodiments as set forth below with reference to the accompanying drawings, wherein:

FIG. 4 is a diagram that shows one structure example of a dummy memory cell sections in the semiconductor memory device shown in FIG. 3;

FIG. 14 is a circuit diagram that shows one example of a dummy memory cell selecting circuit in the semiconductor memory device shown in FIG. 12.

DESCRIPTION OF THE PREFERRED EMBODIMENTS

Before describing the embodiments of the present invention in detail, a conventional semiconductor memory device and problems of this semiconductor memory device will be explained with reference to the drawings.

Various kinds of timing signals that are used in a semiconductor memory device (for example, a DRAM) are generated by a timing signal generating circuit that is provided within the semiconductor memory device. Conventionally, a sense amplifier starting signal (a sense amplifier enabling signal SE) has been generated by adjusting a timing, based on an insertion of a delay circuit that gives a suitable delay time to the timing signal generating circuit. This adjustment has been carried out to generate a sufficient difference in voltage amplitudes in bit lines (BL and BLX) or data buses (DB and DBX), during a period from when a word line signal is activated till when a sense amplifier starting signal is activated. This has been done regardless of variations in the memory cell process.

Figure 1:
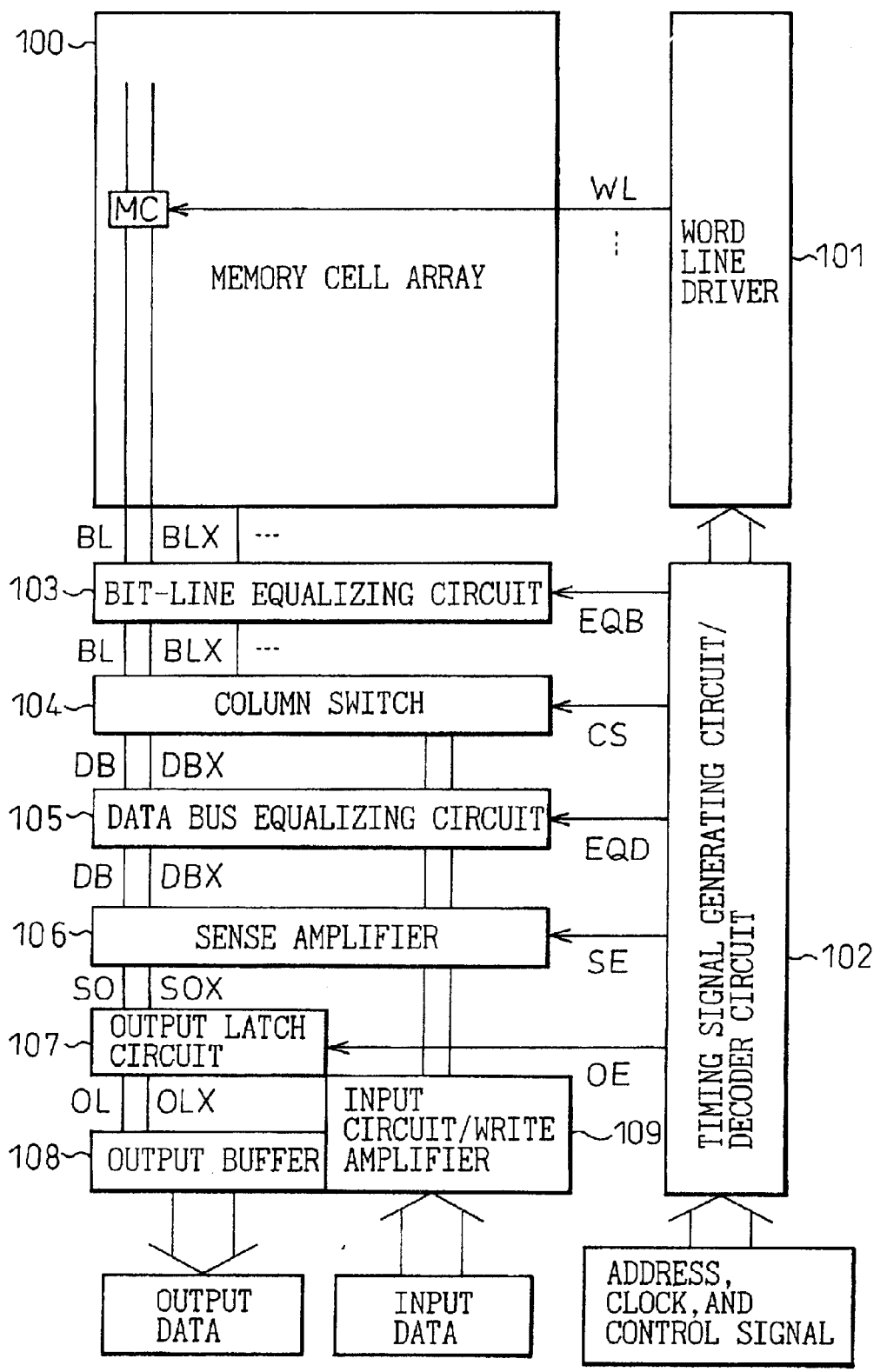
FIG. 1 is a block diagram that schematically shows one example of a conventional semiconductor memory device.

FIG. 1 is a block diagram that schematically shows one example of a conventional semiconductor memory device. In FIG. 1, a reference number 100 denotes a memory cell array, 101 denotes a word line driver, 102 denotes a timing signal generating circuit/decoder circuit, 103 denotes a bit-line equalizing circuit, 104 denotes a column switch, and 105 denotes a data bus equalizing circuit. Further, a reference number 106 denotes a sense amplifier, 107 denotes an output latch circuit, 108 denotes an output buffer, and 109 denotes an input circuit/write amplifier.

The memory cell array 100 is constructed of a plurality of word lines WLs, a plurality of bit lines BL and BLX, and a plurality of memory cells MC that are provided at points of intersection between the word lines WLs and the bit lines (pairs of bit lines) BL and BLX. The timing signal generating circuit/decoder circuit 102 receives an address signal, a clock signal, and a control signal, and generates various kinds of timing signals (various kinds of operation timing control signals EQB, CS, EQD, SE, OE, etc.). At the same time, the timing signal generating circuit/decoder circuit 102 drives a word line WL corresponding to the address signal, via the word line driver 101. The timing signal EQB shows a bit-line equalizing circuit enabling signal, CS shows a column switch selection signal, EQD shows a data bus equalizing circuit enabling signal, SE shows a sense amplifier enabling signal, and OE shows an output latch circuit enabling signal.

The bit-line equalizing circuit 103 is a circuit that equalizes the potentials of the bit lines BL and BLX at a non-access time (for example, a power source voltage Vdd). The column switch 104 is a circuit that selects a predetermined bit line (a pair of bit lines) from among the plurality of bit lines BL and BLX (for example, 32 pairs of bit lines). The data bus equalizing circuit 105 is a circuit that equalizes the potentials of the data buses DB and DBX at a non-access time (for example, a power source voltage Vdd).

The sense amplifier 106 is connected to predetermined bit lines BL and BLX that have been selected by the column switch 104, amplifies data from a memory cell MC that has been selected based on a word line WL corresponding to an address signal, and reads this amplified data. Further, the output latch circuit 107 latches outputs of the sense amplifier 106 (a differential output and a complementary output) SO and SOX, and outputs latched results OL and OLX to the outside as output data via the output buffer 108. The input circuit/write amplifier 109 writes a data corresponding to an input data from the outside, to a predetermined accessed memory cell MC.

Figure 2:
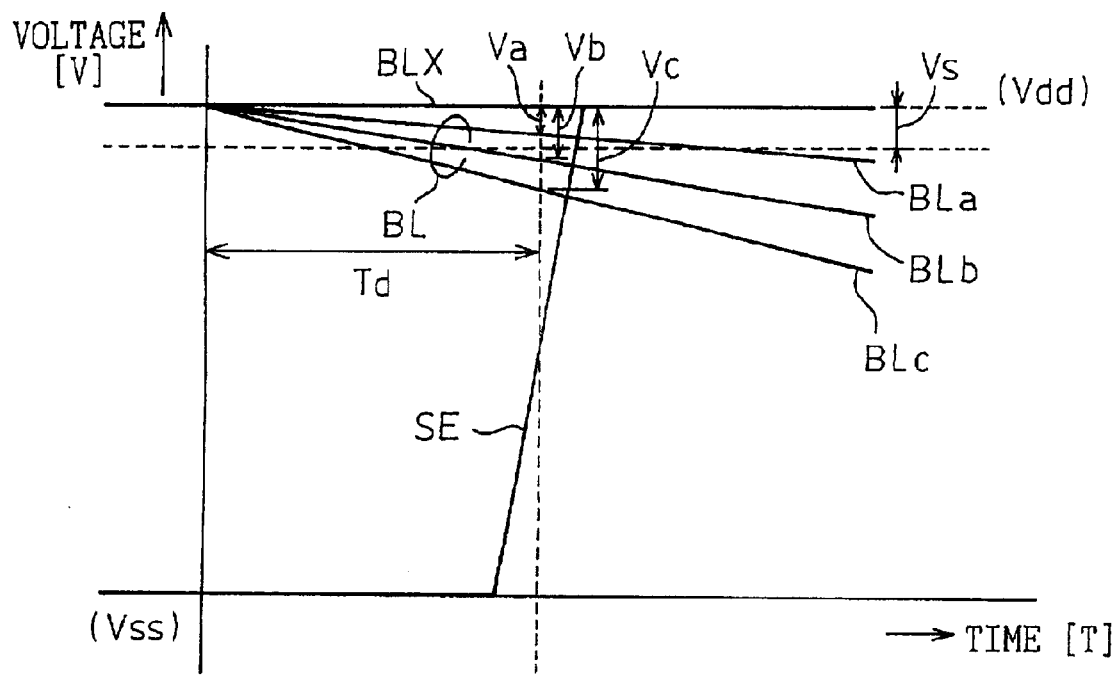
FIG. 2 is a diagram that explains problems of a conventional semiconductor memory device.

FIG. 2 is a diagram that explains problems of a conventional semiconductor memory device. In FIG. 2, a horizontal axis shows time T (lapse time), and a vertical axis shows a voltage V. Reference symbols BLa, BLb and BLc show changes in read potentials of bit lines BL (a bit line BLX has a reference voltage (a power source voltage Vdd)) for a lapse time T, when data of mutually different memory cells MCa, MCb and MCc have been read (these memory cells hold the same data).

As shown in FIG. 2, these memory cells MCa, MCb and MCc have different voltage amplitudes between the bit lines BL and BLX for a lapse time. This is because of variations in semiconductor manufacturing processes and manufacturing lines, or differences in parasitic capacitance at locations of the memory cells in the memory cell array 110, for example.

Conventionally, a delay circuit (for example, a plurality of inverters connected in cascade) provided in the timing signal generating circuit 102 outputs a starting signal (a sense amplifier enabling signal) SE of the sense amplifier 106 after a delay time Td since the selection of a word line WL. As shown in FIG. 2, when the data of the memory cells MCa, MCb and MCc have been read, potentials of bit lines BL are different like BLa, BLb and BLc for the memory cells MCa, MCb and MCc respectively, after a lapse of a delay time Td after a selection of a word line WL.

More specifically, assume that the memory cell MCb (a voltage amplitude between the bit lines BLb and BLX) is a reference, for example. In this case, the memory cell MCa has a small voltage amplitude between the bit lines BLa and BLX for a lapse time, as the gate width of a cell transistor of the memory cell MCa is smaller than that of the memory cell MCb. On the other hand, the memory cell MCc has a large voltage amplitude between the bit lines BLc and BLX for a lapse time, as the gate width of a cell transistor of the memory cell MCc is larger than that of the memory cell MCb. It is needless to mention that a difference in voltage amplitudes between the bit lines of memory cells could actually occur because of various factors, in addition to the variations in the gate widths of the cell transistors.

Assume that a readable voltage (an input offset voltage) of the sense amplifier 106 is Vs. In this case, the sense amplifier 106 cannot correctly read the data of the bit line BLa (the memory cell MCa) that has a smaller voltage (voltage amplitude) between the bit lines BL and BLX than the voltage vs. In general, the input offset voltage Vs of the sense amplifier 106 is required to be about 50 to 100 [mV], although this value depends on variations in semiconductor manufacturing processes and manufacturing lines.

As explained above, in reading the same data that are stored in the memory cells, voltages (voltage amplitudes) are different as follows. The voltage amplitudes between the bit lines BL (BLa, BLb and BLc) and the BLX for a time (lapse time) T of the memory cells MC (MCa, MCb and MCc) that are to be read respectively, are different from each other. This is because of differences in parasitic capacitance at locations of the memory cells in the memory cell array 110, or variations in semiconductor manufacturing processes and manufacturing lines.

Further, the input offset voltage Vs of the sense amplifier 106 also varies depending on the variations in semiconductor manufacturing processes and manufacturing lines, or the temperatures of the environments that are used. Therefore, when it is possible to obtain only the input offset that is below the operation margin of the sense amplifier (the bit line BLa in the memory cell MCa shown in FIG. 2), the sense amplifier 106 cannot correctly read the data. This problem becomes extreme, particularly when the electric characteristics of transistors that constitute memory cells are not sufficient as compared with the electric characteristics of transistors that constitute peripheral circuits of a semiconductor memory device.

As a semiconductor memory device that realizes high-speed operation by generating an activation timing of a sense amplifier without receiving an influence of variations in processes, there has been proposed a semiconductor memory device in Japanese Patent Application Laid-open Publication No. 7-93972. This literature discloses the following. When a word line has been activated, a comparator compares a voltage of a dummy bit line chat is held at a predetermined potential with a reference voltage that has been set in advance. When a voltage of the dummy bit line has become equal to or above the reference voltage, the semiconductor memory device generates an activation signal, and activates the sense amplifier.

According to the above conventional example, however, it is difficult to sufficiently compensate for a deviation in the timing that depends on variations in the semiconductor processes or the like. Further, it is not possible to adjust the timing after a manufacturing in the plant.

The principle of the semiconductor memory device relating to the present invention will be explained next.

In reading a normal memory cell (a real memory cell MC), it is considered that it takes most time for the reading, and an input offset voltage becomes a smallest, when a memory cell located at a furthest position from a decoder circuit or a sense amplifier has been accessed. At the time of reading the above worst-case memory cell, a voltage difference that appears at an input of the sense amplifier that is connected to this worst-case memory cell is expressed as an input offset voltage Vofs-min.

Loads of dummy bit lines (DBL and DBLX) that are connected to dummy cells (DMCs) up to the sense amplifier are set substantially equal to the loads of bit lines that are connected to memory cells provided with the Vofs-min up to the sense amplifier. When these loads are selected at the same timing, the following relationship exists.

$$n*\text{Vofs-min} = \text{Vdd} - \text{Vref}$$

Therefore, the following relationship is obtained:

$$\text{Vofs-min} = (\text{Vdd} - \text{Vref})/n \quad (1)$$

where, n represents a number of dummy memory cells, Vref represents a reference voltage, and Vdd represents a power source voltage. It is assumed that the electric characteristics of a transfer gate of a memory cell have ideal saturation characteristics between the reference voltage Vref and the power source voltage Vdd.

Therefore, it is possible to obtain a predetermined Vofs-min, by setting Vdd, Vref and n to predetermined values respectively at the time of designing a circuit and a layout. For example, when Vdd=1.2 [V], Vref=0.6 [V], and n=6, the following relationship is obtained.

$$\begin{aligned} \text{Vofs} - \min &= (Vdd - Vref)/n \quad (2) \\ &= (1.2 - 0.6)/6 \\ &= 0.1 \ [V] \end{aligned}$$

Consequently, it is possible to obtain a constant input offset voltage.

In actual practice, depending on a circuit structure, the following situations occur. There occurs a time difference between a selection of a memory cell (MC) and a selection of a dummy memory cell (DMC). There occurs a delay from when a comparator circuit 204 produces an output till when a sense amplifier actually starts. Further, there occurs an error between the load of a dummy system and the load of a normal system. Therefore, actual Voffset' becomes as follows:

$$\text{Voffset}' = \text{Voffset} + \Delta V \quad (3)$$

where, $\Delta V$ represents a voltage difference that is generated due to a time difference between the selection of a memory cell and the selection of a dummy memory cell, and the above error. Voffset becomes larger than $\Delta V$, in a word structure in which variations in semiconductor processes become a problem. In other words, when a physical length of a certain independent memory cell array block in a bit-line direction becomes larger than a physical length of a word line, Voffset becomes larger than $\Delta V$. Therefore, a relative contribution of $\Delta V$ is reduced.

Consequently, when a circuit and a layout are designed to meet a relationship of $\Delta V>0$, it becomes possible to set Vofs-min as a minimum value of an input offset that is guaranteed for any sense amplifier, and it becomes possible to regard $\Delta V$ as a margin of process variations.

According to the present invention, it is possible to easily set an optional timing to an optimum reference voltage value that is determined based on a combination of a reference voltage generating circuit and a comparator circuit to be used. The wiring load of a dummy system is equal to the wiring load of a normal system. Further, according to the present invention, it is possible to adjust the timing to an optional timing, even after manufacturing a semiconductor memory device at the plant. That it is possible to adjust the timing to an optional timing means that it is possible to set an input offset value of a sense amplifier to an optional value. As explained above, according to the present invention, it is possible to generate a predetermined sense amplifier input offset voltage having small variation in a dummy bit line or a dummy data bus. Based on this, it is possible to substantially improve the operation margin of a semiconductor memory device, even when there are variations in semiconductor manufacturing processes, temperatures, and manufacturing lines.

Embodiments of a semiconductor memory device relating to the present invention will be explained in detail below with reference to the attached drawings.

Figure 3:
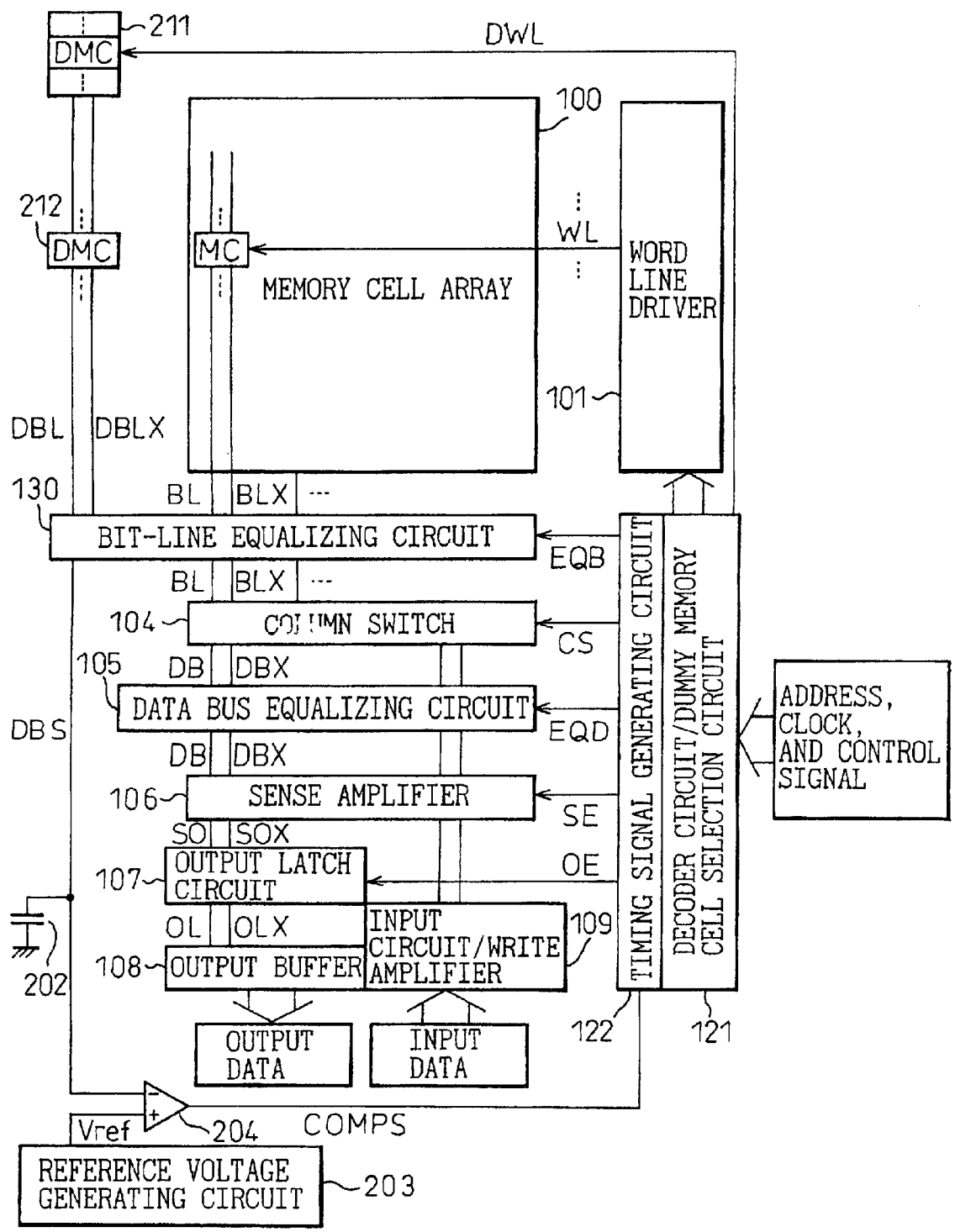
FIG. 3 is a block diagram that schematically shows a first embodiment of a semiconductor memory device relating to the present invention.

FIG. 3 is a circuit diagram that shows a first embodiment of a semiconductor memory device relating to the present invention. This shows a strong-arm latch type differential sense amplifier circuit that is constructed of CMOS transistors.

In FIG. 3, a reference number 100 denotes a memory cell array, 101 denotes a word line driver, 121 denotes a decoder circuit/dummy memory cell selecting circuit, and 122 denotes a timing signal generating circuit. A reference number 130 denotes a bit-line equalizing circuit, 104 denotes a column switch, and 105 denotes a data bus equalizing circuit. A reference number 106 denotes a sense amplifier, 107 denotes an output latch circuit, 108 denotes an output buffer, 109 denotes an input circuit/write amplifier, and 202 denotes a dummy load capacitance. Further, 203 denotes a reference voltage generating circuit, 204 denotes a comparator, 211 denotes reading dummy memory cell section, and 212 denotes a load dummy memory cell section. As is clear from the comparison between FIG. 1 and FIG. 3, reference numbers that are the same as those in FIG. 1 denote similar circuits.

The memory cell array 100 is constructed of a plurality of word lines WLs, a plurality of bit lines BL and BLX, and a plurality of memory cells MC that are provided at points of intersection between the word lines WLs and the bit lines (pairs of bit lines) BL and BLX. In the first embodiment, there are provided dummy memory cell sections 211 and 212 which include dummy memory cells DMCs that are provided close to or adjacent to the memory cell array 100 and that mimic the actual memory cells MCs. The dummy memory cell section 212 is a load dummy memory cell section. These load dummy memory cell sections 212 are provided corresponding to a number of memory cells (MCs) that are actually connected to a plurality of bit lines BL and BLX, in order to reproduce the load (capacitance) of these memory cells that are connected to these actual bit lines. Structures of the dummy memory cell sections will be explained in detail later with reference to FIG. 4, FIG. 5A and FIG. 5B.

The bit-line equalizing circuit 130 is a circuit that equalizes the potentials of the bit lines BL and BLX, and the dummy bit lines DBL and DBL at a non-access time (for example, a power source voltage Vdd). The column switch 104 is a circuit that selects a predetermined bit line (a pair of bit lines) from among the plurality of bit lines BL and BLX (for example, 32 pairs of bit lines). The data bus equalizing circuit 105 is a circuit that equalizes the potentials of the data buses DB and DBX at a non-access time (for example, a power source voltage Vdd).

The sense amplifier 106 is connected to predetermined bit lines BL and BLX that have been selected by the column switch 104, amplifies a data from a memory cell MC that has been selected by a word line WL corresponding to an address signal, and reads this amplified data. Further, the output latch circuit 107 latches outputs of the sense amplifier 106 (a differential output and a complementary output) SO and SOX, and outputs latched results OL and OLX to the outside as output data via the output buffer 108. The input circuit/write amplifier 109 writes a data corresponding to an input data from the outside, to a predetermined accessed memory cell MC. FIG. 3 shows only one example of a semiconductor memory device, and it is possible to replace the sense amplifier 160 with the data bus equalizing circuit 105, for example.

The decoder circuit/dummy memory cell selecting circuit 121 receives an address signal, a clock signal, and a control signal, and drives a word line WL corresponding to the address signal, via the word line driver 101. At the same time, the decoder circuit/dummy memory cell selecting circuit 121 controls the reading dummy memory cell section 211 via dummy word line DWL. In other words, the decoder circuit/dummy memory cell selecting circuit 121 controls the dummy memory cells DMCs that are connected to the dummy bit lines DBL and DBLX in the reading dummy memory cell section 211 via the dummy word line DWL.

Various kinds of timing signals (various kinds of operation timing control signals EQB, CS, EQD, SE, OE, etc.) are generated by the timing signal generating circuit 122. This timing signal generating circuit 122 is supplied with an output signal COMPS of the comparator circuit 204. The timing signal EQB shows a bit-line equalizing circuit enabling signal, CS shows a column switch selection signal, EQD shows a data bus equalizing circuit enabling signal, SE shows a sense amplifier enabling signal, and OE shows an output latch circuit enabling signal.

The comparator circuit 204 receives a reference voltage Vref that has been generated in the reference voltage generating circuit 203 and potentials of the dummy bit lines DBL and DBLX (a dummy bit signal line DBS), and compares between these signals. In other words, the potentials of the dummy bit lines DBL and DBLX are equalized by the bit-line equalizing circuit 130. The potential of the dummy bit line (DBL) is given to a negative input of the comparator circuit 204 based on the dummy bit signal line DBS, and this is compared with the reference voltage Vref that has been applied to a positive input of the comparator circuit 204.

In the dummy bit signal line DBS that is a wiring route from the bit-line equalizing circuit 130 to the comparator circuit 204, the following is provided. There is provided the dummy load capacitance 202 that mimics a delay of signals of the actual bit lines BL and BLX when these signals pass through the column switch 104, the data bus equalizing circuit 105, and the sense amplifier 106. The dummy bit lines DBL and DBLX and the dummy bit signal line DBS need not be provided at the furthest end of the word line in order to ensure the operation margin based on various timing signals. Instead, the dummy bit lines DBL and DBLX and the dummy bit signal line DBS may be disposed at optional positions of the memory cell array 100. Further, it is also possible to dispose the timing signal generating circuit 122 and others at optional positions.

FIG. 4 is a diagram that shows one structure example of the dummy memory cell sections in the semiconductor memory device shown in FIG. 3.

As shown in FIG. 4, the load dummy memory cell section 212 is constructed of a plurality of dummy memory cells DMCs that are connected to the dummy bit lines DBL and DBLX. This is similar to the case where a plurality of memory cells MCs are connected to the actual bit lines BL and BLX. The load dummy memory cell section 212 is structured to mimic the load of the actual bit lines BL and BLX using the dummy bit lines DBL and DBLX. The reading dummy memory cell section 211 is structured to connect the plurality of dummy memory cells DMCs to the dummy bit lines DBL and DBLX according to the dummy word lines DWLs. The number of the dummy memory cells DMCs to be connected is adjusted using switches SWs.

Figure 5A:
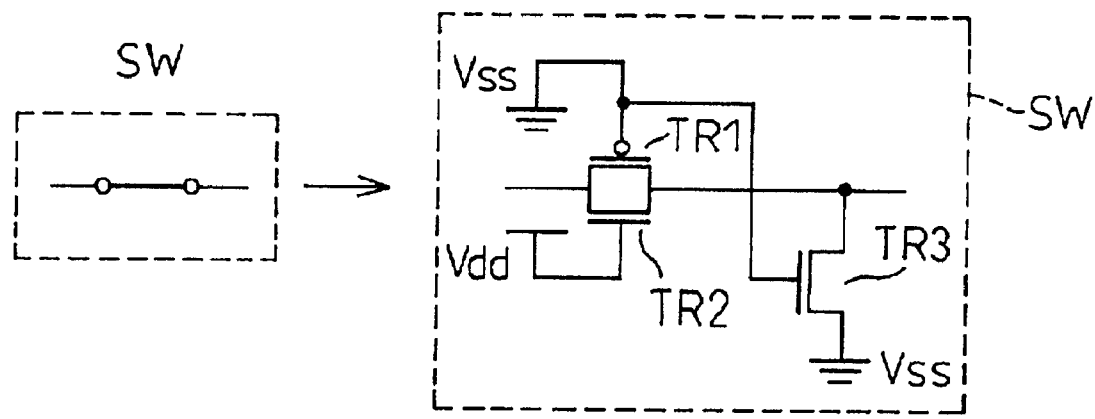
FIG. 5A and FIG. 5B are diagrams that explain one example of a switch shown in FIG. 4.
Figure 5B:
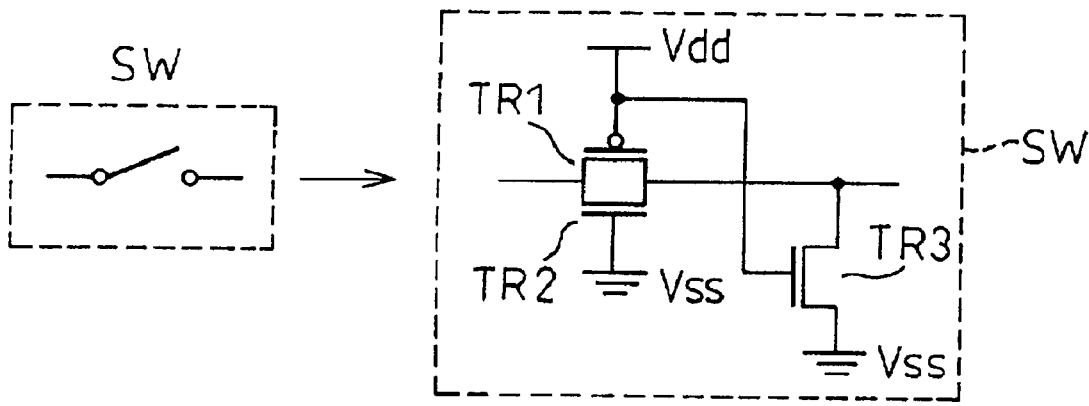

FIG. 5A and FIG. 5B are diagrams that explain one example of a switch SW shown in FIG. 4. FIG. 5A shows a switch in the ON status, and FIG. 5B shows a switch in the OFF status.

As shown in FIG. 5A and FIG. 5B, each switch is structured as a resetting switch that has one p-channel-type MOS transistor (pMOS transistor) TR1, and two n-channel-type MOS transistors (nMOS transistors) TR2 and TR3. As shown in FIG. 5A, when the switch SW is in the ON status, the gates of the transistors TR1 and TR3 are connected to a low-potential power source line Vss. The gate of the transistor TR2 is connected to a high-potential power source line (power source voltage) of Vdd. In this case, the transistors TR1 and TR2 (transfer gates) are turned ON, and the transistor TR3 is turned OFF. On the other hand, as shown in FIG. 5B, when the switch SW is in the OFF status, the gates of the transistors TR1 and TR3 are connected to the high-potential power source line Vdd. The gate of the transistor TR2 is connected to the low-potential power source line Vss. In this case, the transistors TR1 and TR2 are turned OFF, and the transistor TR3 is turned ON. In other words, the number of dummy memory cells DMCs that are connected to the dummy bit lines DBL and DBLX at the same time is controlled by each switch SW.

In the reading dummy memory cell section 211, each dummy memory cell DMC is provided with a switch SW. Each switch SW adjusts the number of dummy memory cells DMCs that are driven based on the dummy word line DWL. Based on this, a change in the voltage amplitude of the dummy bit lines DBL and DBLX for a lapse time (T) (a potential of the dummy bit signal line DBS) is controlled. It is possible to set each switch (at the same time, the number of dummy memory cells DMCs that are connected to the dummy bit lines DBL and DBLX), by using a fuse and a non-volatile memory. Alternatively, it is possible to set each switch and the number of dummy memory cells DMCs, based on a control signal from the outside (for example, a dummy memory cell selection control signal) as described later.

Figure 6A:
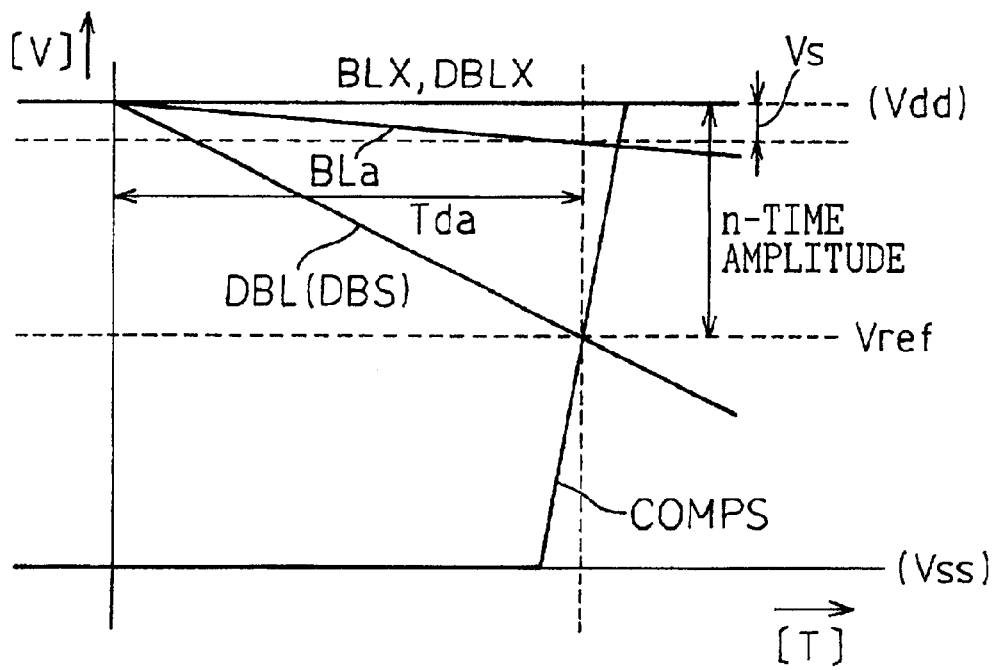
FIG. 6A, FIG. 6B, and FIG. 6C are diagrams that explain the operation of the semiconductor memory device shown in FIG. 3.
Figure 6B:
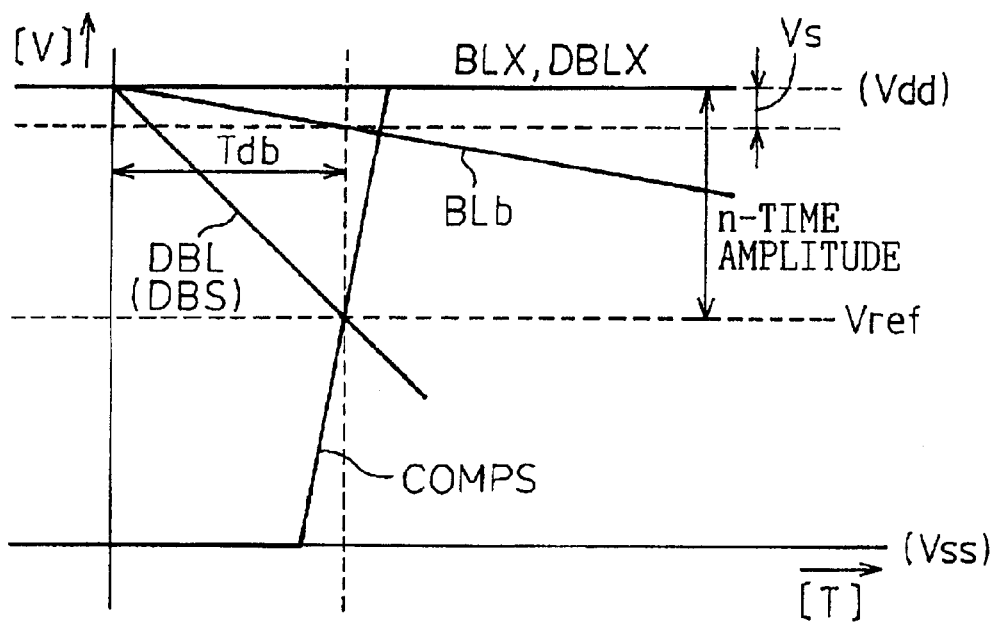
Figure 6C:
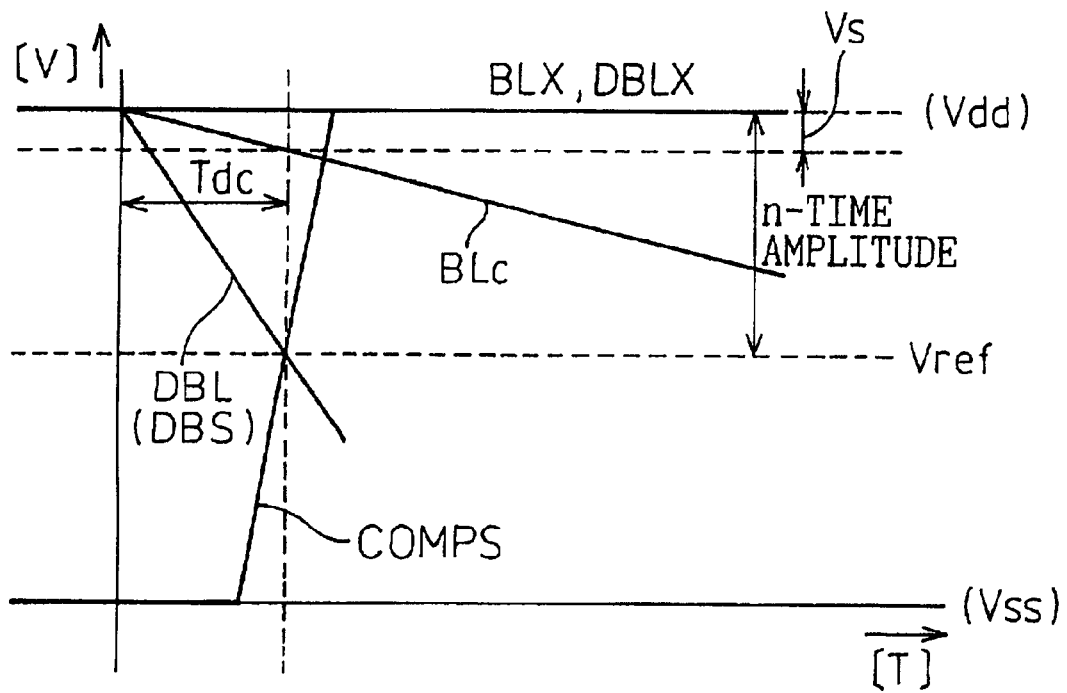

FIG. 6A, FIG. 6B, and FIG. 6C are diagrams that explain the operation of the semiconductor memory device shown in FIG. 3. FIG. 6A shows the operation of reading a data of the memory cell MCa (the bit line BLa) shown in FIG. 2. FIG. 6B shows the operation of reading a data of the memory cell MCb (the bit line BLb). FIG. 6C shows the operation of reading a data of the memory cell MCc (the bit line BLc).

In FIG. 6A to FIG. 6C, a horizontal axis shows time T (lapse time), and a vertical axis shows a voltage V. Reference symbols BLa, BLb and BLc show changes in read potentials of bit lines BL (a bit line BLX has a reference voltage (a power source voltage Vdd)) for a lapse time T, when data of mutually different memory cells MCa, MCb and MCc have been read (these memory cells hold the same data). A reference symbol DBL shows changes in a potential of a dummy bit line DBL (a dummy bit signal line DBS) for a time lapse T at the time of reading the memory cells MCa, MCb and MCc (a dummy bit line DBLX has a reference voltage (a power source voltage Vdd)). A reference symbol COMPS shows changes in a potential of an output of the comparator circuit 204 for a time lapse T.

As shown in FIG. 6A to FIG. 6C, at the time of reading data of the memory cells MCa, MCb and MCc that have different voltage amplitudes between the bit lines BL (BLa, BLb and BLc) and BLX for a lapse time T respectively, the following control is carried out. The loads of the dummy bit lines DBL and DBLX are controlled (for example, the number of dummy memory cells DMCs in the reading dummy memory cell section 211 that are connected to the dummy bit lines DBL and DBLX, is adjusted). Based on this, the output signal COMPS of the comparator circuit 204 is changed (is made to rise) at a suitable timing, and various kinds of timing signals are generated at suitable timings.

Specifically, as shown in FIG. 6A, for the memory cell MCa that has a small voltage amplitude between the bit lines BLa and BLX for a lapse time T at the reading time, the number of dummy memory cells DMCs in the reading dummy memory cell section 211 that are connected to the dummy bit lines DBL and DBLX is decreased. Based on this, a change in the voltage of the dummy bit line DBL (the dummy bit signal line DBS) for the lapse time T is made smaller, and a time taken for this voltage to become lower than the reference voltage Vref is made longer. In other words, for the memory cell MCa, a time (a delay time Tda) for the output signal COMPS, in the comparator circuit 204, to rise is set long to match the change in the voltage amplitude between the bit lines BLa and BLX for the lapse time T, at the time of reading the memory cell MCa.

This similarly applies to the memory cell MCb that has a standard voltage amplitude between the bit lines for a lapse time at the reading time, and to the memory cell MCc that has a large voltage amplitude between the bit lines for a lapse time at the reading time that are shown in FIG. 6B and FIG. 6C respectively.

Therefore, as shown in FIG. 6C, for the memory cell MCc that has a large voltage amplitude between the bit lines BLc and BLX for a lapse time T at the reading time, the number of dummy memory cells DMCs in the reading dummy memory cell section 211 that are connected to the dummy bit lines DBL and DBLX is increased. Based on this, a change in the voltage of the dummy bit line DBL (the dummy bit signal line DBS) for the lapse time T is made larger, and a time taken for this voltage to become lower than the reference voltage Vref is made shorter. In other words, for the memory cell MCc, a time (a delay time Tdc) taken for the output signal COMPS in the comparator circuit 204 to rise is set short to match the change in the voltage amplitude between the bit lines BLc and BLX for the lapse time T, at the time of reading the memory cell MCc. With this arrangement, the operation speed is increased.

Figure 7:
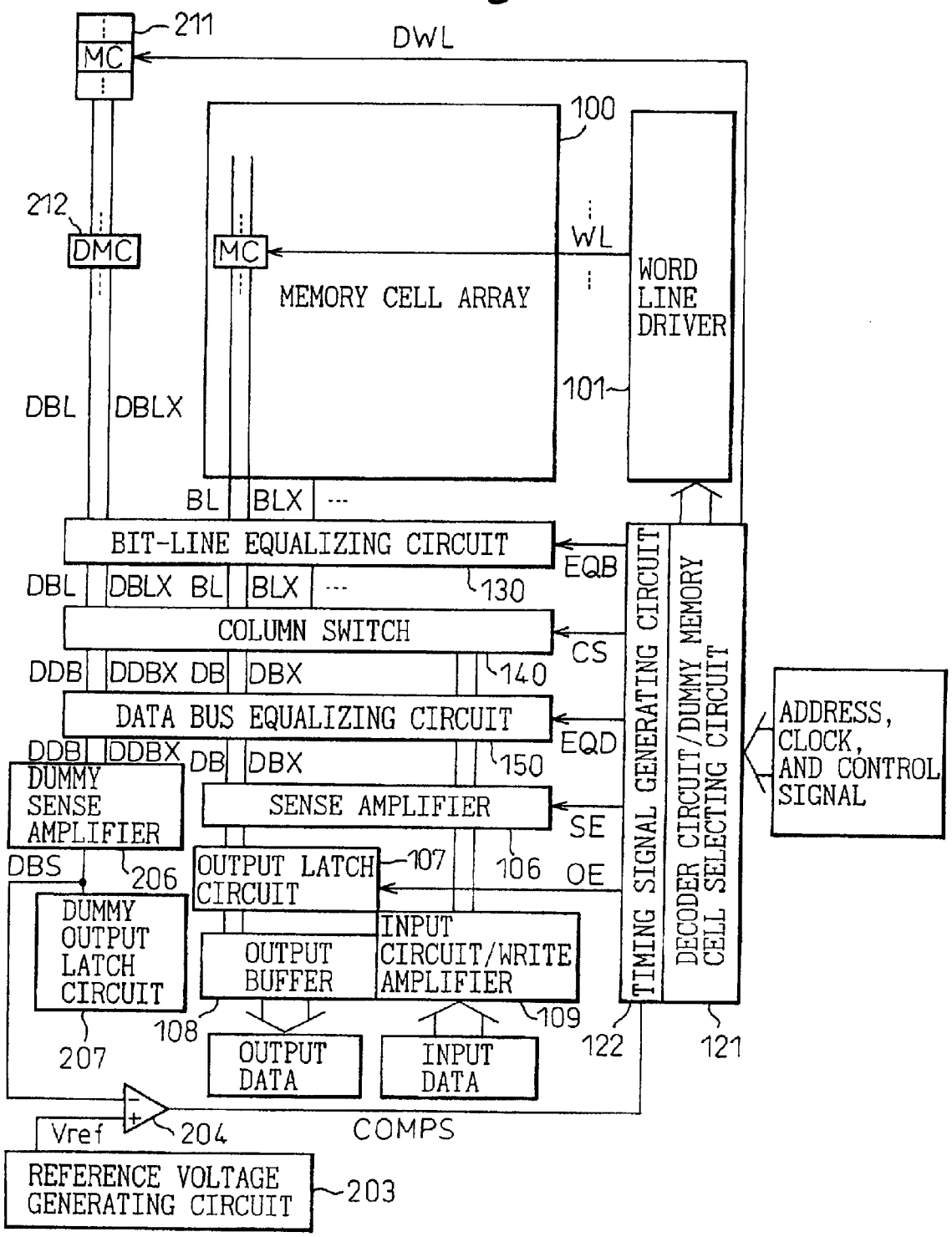
FIG. 7 is a block diagram that schematically shows a second embodiment of a semiconductor memory device relating to the present invention.

FIG. 7 is a block diagram that schematically shows a second embodiment of a semiconductor memory device relating to the present invention.

As is clear from the comparison between FIG. 3 and FIG. 7, according to the second embodiment, for the dummy bit lines DBL and DBLX (in the dummy system), outputs of a bit-line equalizing circuit 130 are also input to a dummy sense amplifier 206 via a column switch 140 and a data bus equalizing circuit 150. This is in a similar manner to that for the actual bit lines BL and BLX. Outputs of the dummy sense amplifier 206 are also supplied to a negative input of a comparator circuit 204. A dummy output latch circuit 207 is provided at an output of the dummy sense amplifier 206. This dummy output latch circuit 207 mimics the load of an output latch circuit 107 that is provided at an output of an actual sense amplifier 106.

In other words, according to the second embodiment, the dummy load capacitance 202 that is provided in the dummy bit signal line DBS that is a wiring route from the bit-line equalizing circuit 130 to the comparator circuit 204 in the first embodiment, is removed. Instead, the loads of the column switch 140, the data bus equalizing circuit 150, the dummy sense amplifier 206, and the dummy output latch circuit 207 are also applied to the dummy system, in a structure similar to the actual circuit structure. Output signals of the dummy sense amplifier 206 are supplied to the comparator circuit 204.

Further, in the second embodiment, the decoder circuit/dummy memory cell selecting circuit 121 controls dummy memory cells DMCs that are connected to dummy bit lines DBL and DBLX in a reading dummy memory cell section 211 via dummy word line DWLs. This is in a similar manner to that of the first embodiment. Further, the dummy memory cell sections (211 and 212) have also similar structures to those of the first embodiment.

Figure 8:
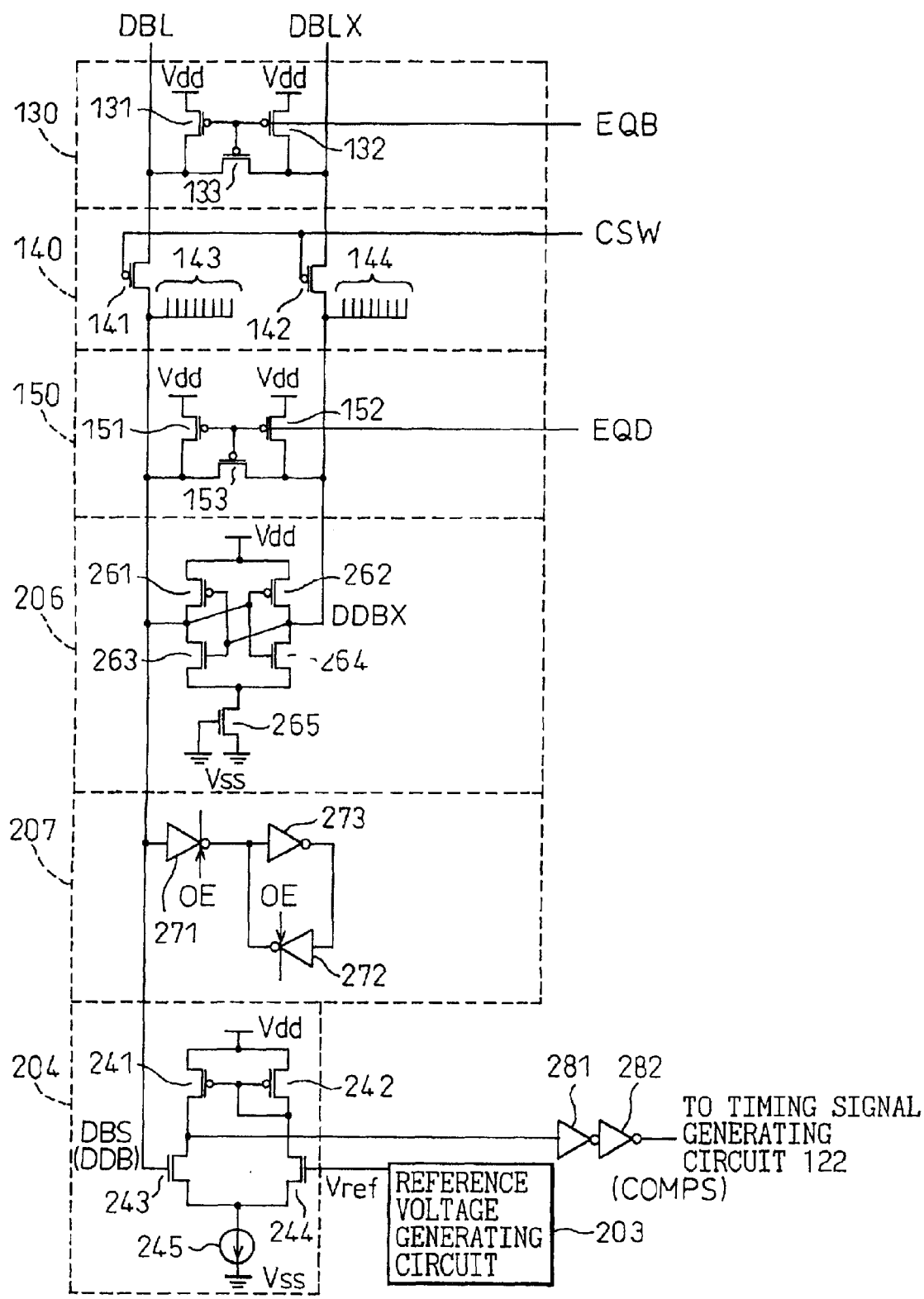
FIG. 8 is a circuit diagram that shows one example of main portions of the semiconductor memory device shown in FIG. 7.

FIG. 8 is a circuit diagram that shows one example of main portions of the semiconductor memory device shown in FIG. 7.

As shown in FIG. 8, the bit-line equalizing circuit 130 has pMOS transistors 131 to 133. The bit-line equalizing circuit 130 equalizes the potentials of complementary dummy bit lines DBL and DBLX to a power source voltage Vdd, based on the activation of a bit-line equalizing circuit enabling signal EQB (that is, when this signal has become at a low level "L"). The column switch 140 selects a predetermined bit line from among a plurality of bit lines, and connects this bit line to a sense amplifier. A plurality of dummy bit lines 143 and 144 are provided for the dummy bit lines DBL and DBLX, and these dummy bit lines mimic the loads of actual bit lines BL and BLX. The pMOS transistors 141 and 142 in the column switch 140 control the connection between the bit-line equalizing circuit 130 and the data bus equalizing circuit 150. The bit-line equalizing circuit 130 and the data bus equalizing circuit 15 are connected to each other, when a signal CSW that is at the same timing as a column switch selection signal CS has become at a low level "L".

The data bus equalizing circuit 150 has pMOS transistors 151 to 153. The data bus equalizing circuit 150 equalizes the potentials of complementary dummy data bus lines DDB and DDBX to the power source voltage Vdd, based on the activation of a data bus equalizing circuit enabling signal EQD (that is, when this signal has become at a low level "L"). The dummy sense amplifier 206 has pMOS transistors 261 and 262, and nMOS transistors 263 to 265, and becomes in a non-operating status, based on the application of a low-potential power source voltage Vss to the gate of the transistor 265.

The dummy output latch circuit 207 is constructed of three inverters 271 to 273. The inverters 272 and 273 constitute a latch. The inverters 271 and 272 are supplied with an output latch circuit enabling signal OE. The dummy output latch circuit 207 may be operated based on the output latch circuit enabling signal OE, in a similar manner to the manner in which the actual output latch circuit 107 is operated. Alternatively, the dummy output latch circuit 207 may be in a non-operating status like the dummy sense amplifier 206, and may mimic only the load of the actual circuit.

The comparator circuit 204 is structured as a current-mirror type differential amplifier that includes pMOS transistors 241 and 242, nMOS transistors 243 and 244, and a current source 245. A potential of a dummy bit signal line DBS (an output of the dummy output latch circuit 207) is applied to one of differential inputs of the comparator circuit 204. An output (a reference voltage Vref) of the reference voltage generating circuit 203 is applied to the other input of the comparator circuit 204. An output signal (COMPS) of the comparator circuit 204 is supplied to a timing signal generating circuit 122 via two-stage inverters (buffers) 281 and 282 for wave shaping.

Figure 9:
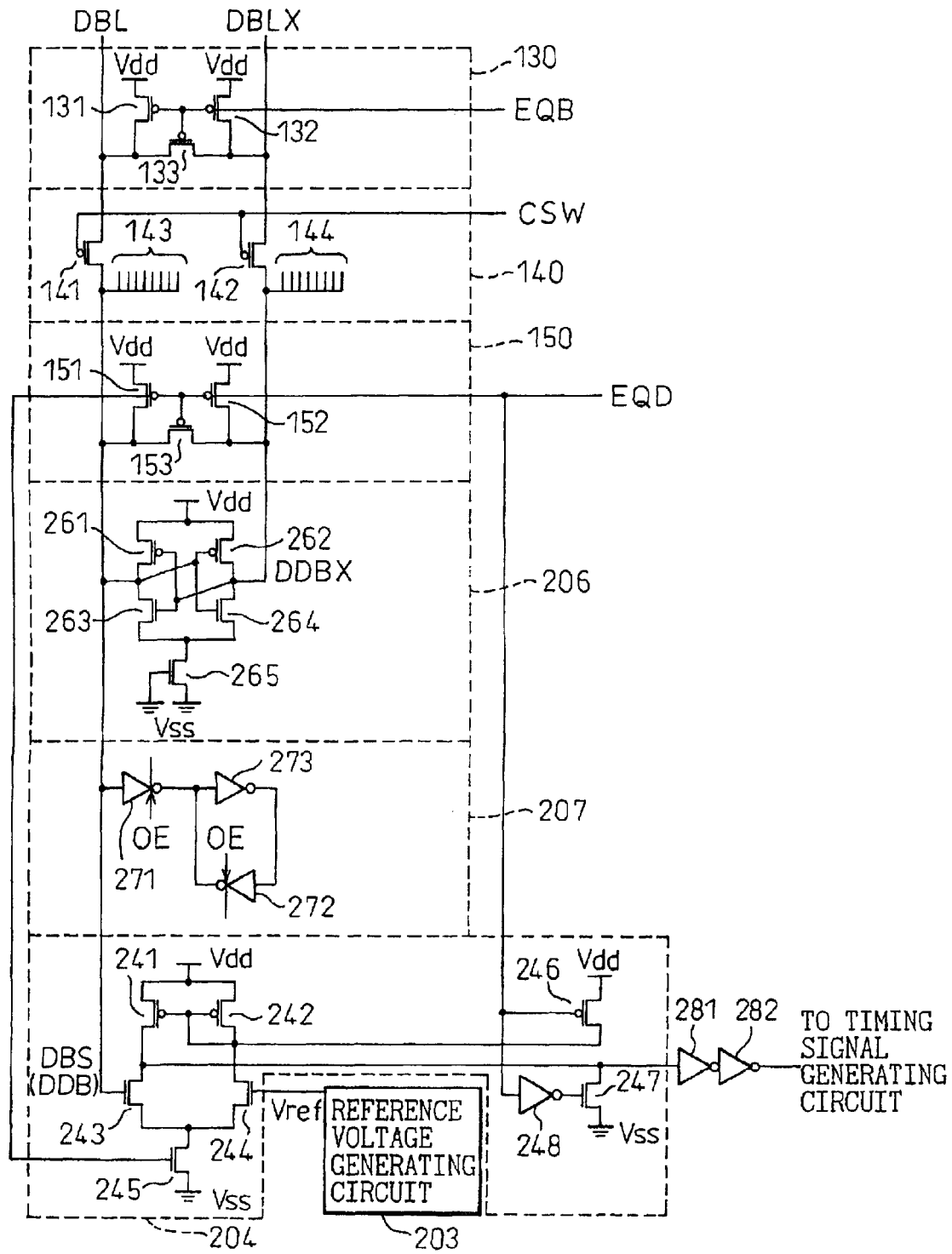
FIG. 9 is a circuit diagram that shows another example of main portions of the semiconductor memory device shown in FIG. 7.

FIG. 9 is a circuit diagram that shows another example of main portions of the semiconductor memory device shown in FIG. 7.

As is clear from the comparison between FIG. 8 and FIG. 9, according to a circuit shown in FIG. 9, the current source of the comparator circuit 204 in the circuit shown in FIG. 8 is structured as an nMOS transistor 245. The gate of the nMOS transistor 245a is supplied with a data bus equalizing circuit enabling signal EQD. Further, there is provided a reset circuit that is controlled based on the data bus equalizing circuit enabling signal EQD.

In other words, when a data bus equalizing circuit 150 is activated based on the data bus equalizing circuit enabling signal EQD (when the potentials are equalized, the signal EQD is at a low level "L"), the transistor 245 is turned OFF, and the comparator circuit (the current-mirror type differential amplifier) 204 becomes inactive. On the other hand, when the data bus equalizing circuit 150 is inactive (when the signal EQD is at a high level "H"), the transistor 245 is turned ON, and the comparator 204 is activated.

As explained above, by controlling the comparator circuit 204, it is possible to interrupt a steady-state current of the comparator circuit (differential amplifier) when a comparison operation is not necessary. With this arrangement, it is possible to lower the current consumption at a waiting time of the semiconductor memory device. As a signal that is supplied to the gate of the transistor 245, it is possible to use a bit-line equalizing circuit enabling signal EQB in place of the data bus equalizing circuit enabling signal EQD. In this case, the comparator circuit 204 becomes inactive when the bit-line equalizing circuit 130 is active. When the bit-line equalizing circuit 130 is inactive, the comparator circuit 204 becomes active, and a similar effect of a reduction in the current consumption is obtained.

Further, the comparator circuit 204 has a reset circuit that is constructed of a pMOS transistor 246, an nMOS transistor 247, and an inverter 248. According to this reset circuit, when the data bus equalizing circuit 150 is activated based on the data bus equalizing circuit enabling signal EQD (when the signal EQD is at a low level "L"), the transistors 246 and 247 are turned ON. Based on this, the comparator circuit (the current-mirror type differential amplifier) is reset, and an output of the comparator circuit is held at a low level "L". On the other hand, when the data bus equalizing circuit 150 is inactivated (when the signal EQD is at a high level "H"), the transistors 246 and 247 are turned OFF.

As explained above, it is possible to prevent the output of the comparator circuit 204 from becoming unstable, based on the provision of the reset circuit at the output of the comparator circuit 204. This is possible by also fixing the output of the comparator circuit (the current-mirror type differential amplifier) to a predetermined voltage status (the low-potential power source voltage Vss, in the present embodiment) when this comparator circuit is in the inactive status. For the reset circuit, it is also possible to use the bit-line equalizing circuit enabling signal EQB in place of the data bus equalizing circuit enabling signal EQD.

Figure 10A:
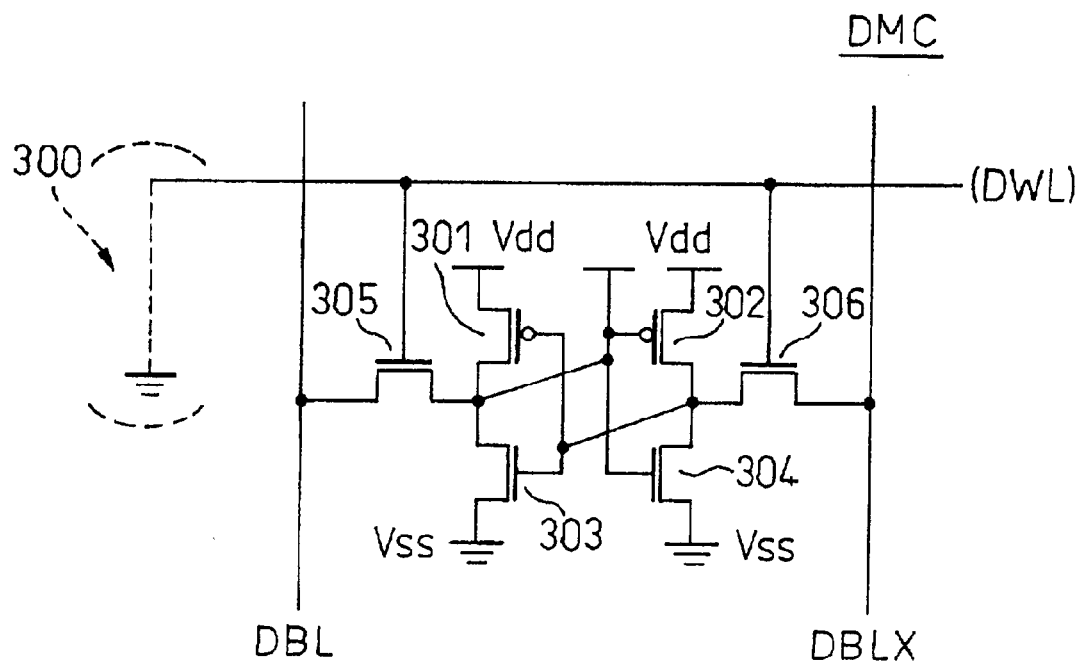
FIG. 10A and FIG. 10B are circuit diagrams that show structure examples of a dummy memory cell in the semiconductor memory device shown in FIG. 7.
Figure 10B:
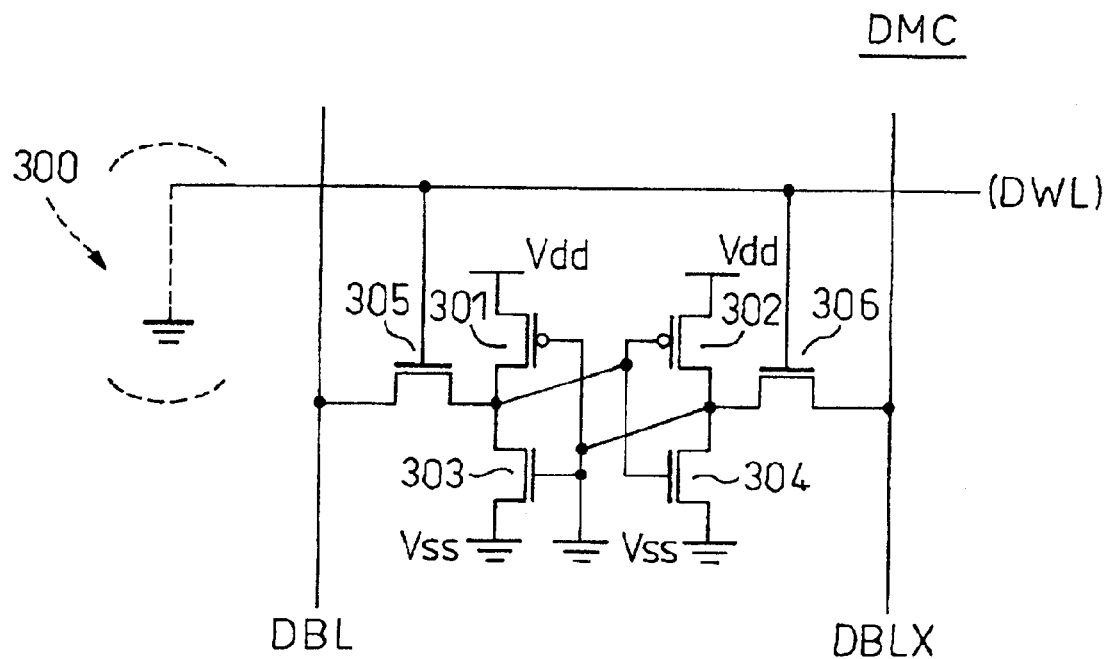

FIG. 10A and FIG. 10B are circuit diagrams that show structure examples of a dummy memory cell in the semiconductor memory device shown in FIG. 7.

Each dummy memory cell DMC shown in FIG. 10A and FIG. 10B respectively is constructed of pMOS transistors 301 and 302, and nMOS transistors 303 to 306. The transistors 305 and 306 are gate transistors. These transistors are turned ON when a dummy word line DWL is at a high level "H". Based on this, dummy memory cells DMCs are connected to dummy bit lines DBL and DBLX. The gates of the transistors 301 and 303 are connected in common to a connection node of the transistors 302 and 304. The gates of the transistors 302 and 304 are connected in common to a connection node of the transistors 301 and 303.

According to the dummy memory cell DMC shown in FIG. 10A, the gates of the transistors 302 and 304 (the connection node of the transistors 301 and 303) are connected to a high-potential power source line (Vdd). According to the dummy memory cell DMC shown in FIG. 10B, the gates of the transistors 301 and 303 (the connection node of the transistors 302 and 304) are connected to a low-potential power source line (Vss). Connection of the dummy memory cells DMCs in a reading dummy memory cell section 211 to the dummy bit lines DBL and DBLX is controlled according to a level of the dummy word line DWL. On the other hand, the gates (dummy word lines DWLs) of the gate transistors 305 and 306 are connected to the low-potential power source line (Vss) 300 to turn OFF the gate transistors 305 and 306. This connection is carried out so that the dummy memory cells DMCs in the load dummy memory cell section 212 mimic the loads of the memory cells MCs that are connected to the non-selected actual word lines WLs.

Figure 11:
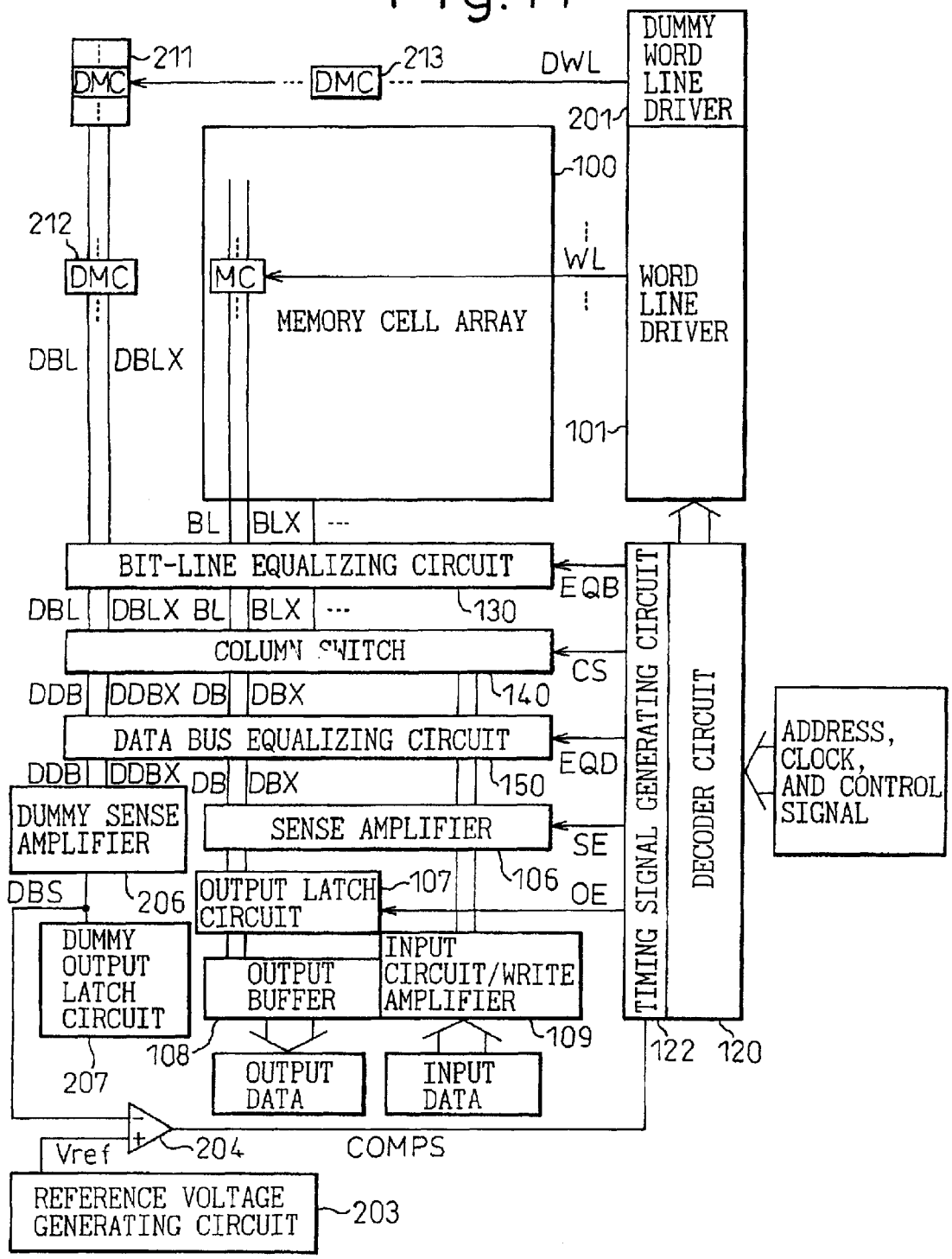
FIG. 11 is a block diagram that schematically shows a third embodiment of a semiconductor memory device relating to the present invention.

FIG. 11 is a block diagram that schematically shows a third embodiment of a semiconductor memory device relating to the present invention.

As is clear from the comparison between FIG. 7 and FIG. 11, according to the third embodiment, a decoder circuit 120 is added, instead of the decoder circuit/dummy memory cell selecting circuit 121 in the second embodiment, and a dummy word driver 201 drives dummy word lines DWLs. Further, in the dummy word lines DWLs, there is provided a load dummy memory cell section 213 that mimics the loads of a plurality of memory cells MCs that are provided on the actual word lines WLs.

As explained above, it is possible to generate a dummy memory cell selection signal according to the dummy word lines DWLs, based on a logical combination of signals for making the dummy word driver 201 select word lines WLs. Therefore, when the dummy memory cells DMCs are set at the furthest end from the dummy word lines DWLs or the word lines WLs (physical position of the decoder circuit 121) the following is guaranteed. It is guaranteed that a selection of a dummy memory cell DMC includes a timing delay of the worst case, from the viewpoint of the length of a signal transmission bus, as compared with a selection of a normal memory cell MC.

Each dummy memory cell DMC in the load dummy memory cell section 213 has a structure similar to that of a dummy memory cell DMC in the reading dummy memory cell section 211 that is shown in FIG. 10A and FIG. 10B.

Figure 12:
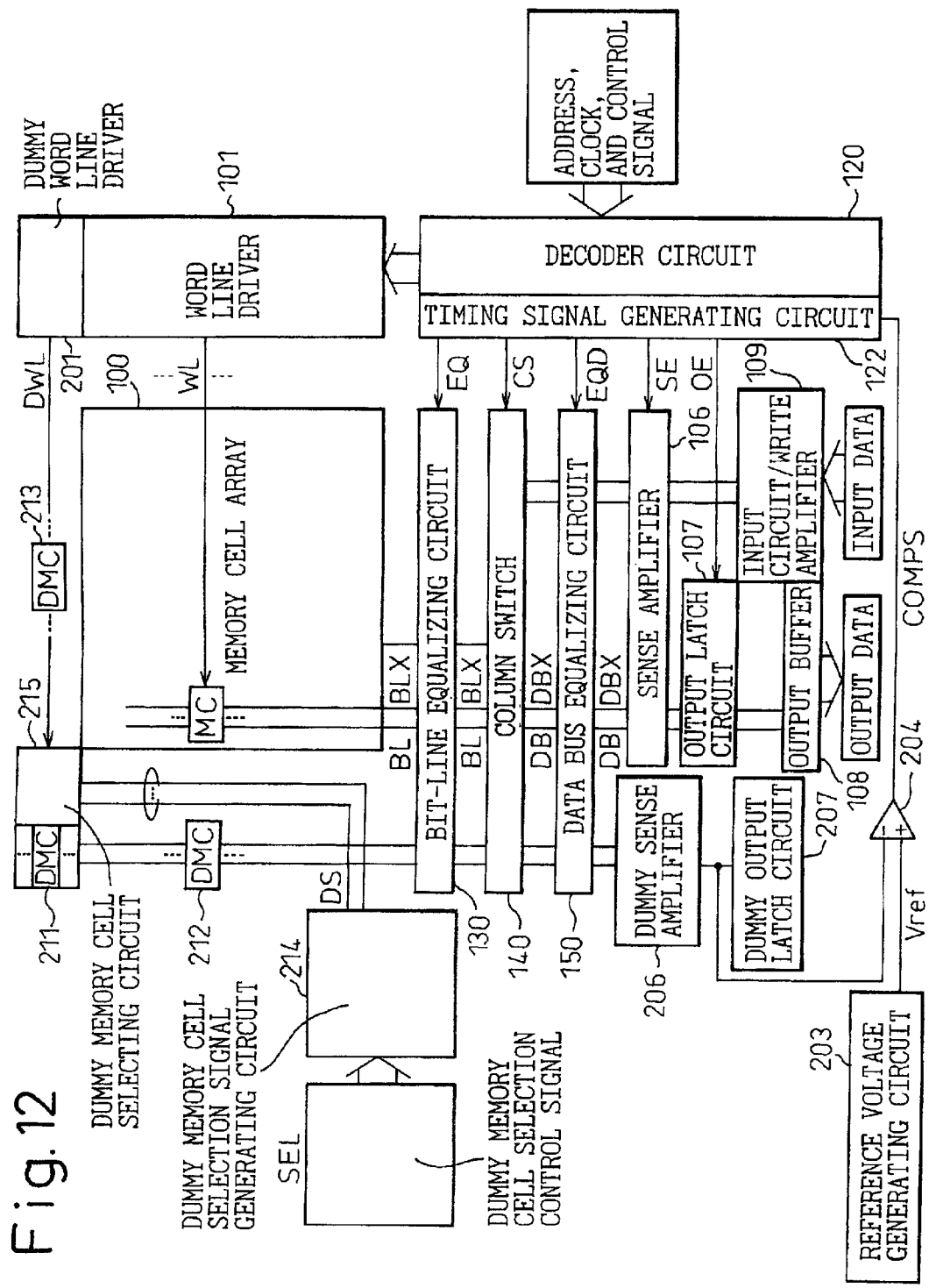
FIG. 12 is a block diagram that schematically shows a fourth embodiment of a semiconductor memory device relating to the present invention.

FIG. 12 is a block diagram that schematically shows a fourth embodiment of a semiconductor memory device relating to the present invention.

As is clear from the comparison between FIG. 11 and FIG. 12, according to the fourth embodiment, a structure of a reading dummy memory cell section 211 is different from that in the third embodiment. According to the fourth embodiment, a selection of a dummy memory cell DMC in the reading dummy memory cell section 211 is controlled based on a dummy memory cell selection control signal that is input from the outside. In other words, in the fourth embodiment, there are provided a dummy memory cell selection signal generating circuit 214, and a dummy memory cell selecting circuit 215. The dummy memory cell selection signal generating circuit 214 generates a dummy memory cell selection signal DS according to a dummy memory cell selection control signal SEL that is input from the outside. The dummy memory cell selecting circuit 215 selects a plurality of dummy memory cells DMCs that are connected simultaneously within the reading dummy memory cell section 211 according to the dummy memory cell selection signal DS.

Figure 13:
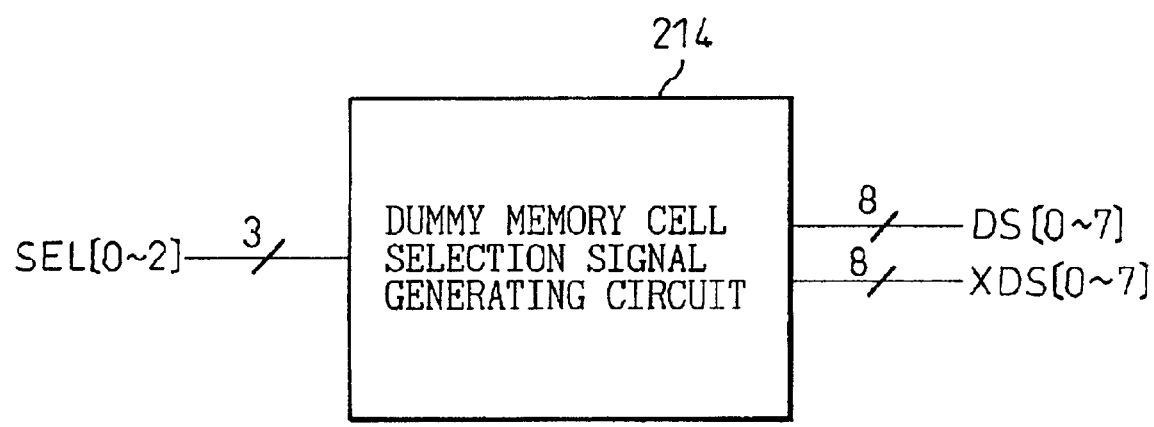
FIG. 13 is a block diagram that shows one example of a dummy memory cell selection signal generating circuit in the semiconductor memory device shown in FIG. 12.

FIG. 13 is a block diagram that shows one example of a dummy memory cell selection signal generating circuit in the semiconductor memory device shown in FIG. 12. In the following explanation, a maximum number of dummy memory cells DMCs that are selected in the reading dummy memory cell section 211 is eight. However, it is needless to mention that this number can be flexibly changed in the present invention.

As shown in FIG. 13, the dummy memory cell selection signal generating circuit 214 decodes three bits of dummy memory cell selection control signals SEL [0] to SEL [2] that are supplied from the outside. The dummy memory cell selection signal generating circuit 214 generates eight complementary dummy memory cell selection signals DS [0], XDS [0] to DS [7], and XDS [7], and supplies these signals to the dummy memory cell selecting circuit 215.

The dummy memory cell selection control signals SEL [0] to SEL [2] may be control signals that are supplied from an external CPU of chip or RAM macro, a memory managing unit, or other control block, for example. Alternatively, these dummy memory cell selection control signals may be data that are held in a non-volatile memory like a fuse ROM, an EEPROM, or a flash memory. Based on the above structure, it is possible to prevent an occurrence of a failure in a timing margin of a sense amplifier or the like, by changing an access time of a RAM (a semiconductor device) after finishing a pre-stage of a semiconductor.

The following is a truth table of the dummy memory cell selection control signals SEL [0] to SEL [2] and the dummy memory cell selection signals DS [0], XDS [0] to DS [7], and XDS [7] in the dummy memory cell selection signal generating circuit 214.

TABLE 1

[TRUTH TABLE OF DUMMY MEMORY CELL SELECTION SIGNAL GENERATING CIRCUIT]

| SEL[0] | SEL[1] | SEL[2] | DS[0] | DS[1] | DS[2] | DS[3] | DS[4] | DS[5] | DS[6] | DS[7] |
|---|---|---|---|---|---|---|---|---|---|---|
| 0 | 0 | 0 | 1 | 0 | 0 | 0 | 0 | 0 | 0 | 0 |
| 0 | 0 | 1 | 1 | 1 | 0 | 0 | 0 | 0 | 0 | 0 |
| 0 | 1 | 0 | 1 | 1 | 1 | 0 | 0 | 0 | 0 | 0 |
| 0 | 1 | 1 | 1 | 1 | 1 | 1 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 0 | 0 |
| 1 | 1 | 0 | 1 | 1 | 1 | 1 | 1 | 1 | 1 | 0 |
| 1 | 1 | 1 | 1 | 1 | 1 | 1 | 1 | 1 | 1 | 1 |

(*) XDS [0–7] are an inverse logic of DC [0–7]

FIG. 14 is a circuit diagram that shows one example of the dummy memory cell selecting circuit 215 in the semiconductor memory device shown in FIG. 12.

As shown in FIG. 14, the dummy memory cell selecting circuit 215 includes eight switches SW0 to SW7 that are switching controlled based on the dummy memory cell selection signals DS [0], XDS [0] to DS [7], and XDS [7]. These switches SW0 to SW7 control connections between eight dummy memory cells DMC0 to DMC7 and dummy word lines DWLs in the reading dummy memory cell section 211 respectively. Each of the switches SW0 to SW7 is structured as a resetting switch that has one pMOS transistor and two nMOS transistors, as explained with reference to FIG. 5A and FIG. 5B. When the transfer gate of a dummy memory cell DMC is the nMOS transistor (305, 306), the switch is reset based on the nMOS transistor (the nMOS transistor is turned OFF at a low level "L"). When the transfer gate of a dummy memory cell DMC is the pMOS transistor, the switch is reset based on the pMOS transistor (the pMOS transistor is turned OFF at a high level "H").

As explained above, the dummy memory cell selecting circuit 215 (switch SW) changes the number of dummy memory cells DMCs in the reading dummy memory cell section 211. With this arrangement, it becomes possible to adjust the number of dummy memory cells DMCs based on an input signal from the outside, and it is possible to adjust the sense amplifier offset input voltage, after finishing the semiconductor manufacturing process.

The output signal (COMPS) of the comparator circuit 204 obtained in the present invention can be used to generate an internal timing signal of other semiconductor memory device, not only for the starting signal of the sense amplifier. For example, when the output signal (COMPS) is used to generate a word line reset signal, a pre-charge signal, and an equalization starting signal, etc., it becomes possible to complete the read/write operation of the semiconductor memory device (RAM) in a minimum necessary operation time. Further, it becomes possible to realize high-cycle operation and reduce power consumption during the operation at the same time.

As explained in detail, according to the present invention, it is possible to provide a semiconductor memory device that can substantially improve the operation margin and can further increase the operation speed regardless of variations in semiconductor manufacturing processes and manufacturing lines.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device comprising:
   a dummy bit line having a load equal to a load of a bit line;
   a reference voltage generating circuit generating a reference voltage;
   a comparator circuit comparing a potential of said dummy bit line with the reference voltage; and
   a timing signal generating circuit generating various kinds of timing signals based on an output of said comparator circuit, wherein
   said semiconductor memory device simultaneously selects a plurality of dummy memory cells and connects the selected dummy memory cells to said dummy bit line, and adjusts the potential of said dummy bit line.

2. The semiconductor memory device as claimed in claim 1, wherein said dummy memory cells are a plurality of reading dummy memory cells that are driven by a dummy word line.

3. The semiconductor memory device as claimed in claim 2, wherein a plurality of load dummy memory cells are connected to said dummy word line.

4. The semiconductor memory device as claimed in claim 1, wherein a plurality of load dummy memory cells are connected to said dummy bit line.

5. The semiconductor memory device as claimed in claim 1, wherein the number of said dummy memory cells that are connected simultaneously is adjusted in a layout process.

6. The semiconductor memory device as claimed in claim 1, further comprising:
   a switching circuit controlling the number of dummy memory cells that are connected simultaneously.

7. The semiconductor memory device as claimed in claim 1, further comprising:
   a dummy memory cell selection signal generating circuit generating a dummy memory cell selection signal according to a dummy memory cell selection control signal; and
   a dummy memory cell selecting circuit selecting a plurality of dummy memory cells that are connected simultaneously according to the dummy memory cell selection signal.

8. The semiconductor memory device as claimed in claim 7, wherein said dummy memory cell selecting circuit is formed as a switch having a reset function.

9. The semiconductor memory device as claimed in claim 1, wherein said comparator circuit is a current-mirror type differential amplifier.

10. The semiconductor memory device as claimed in claim 1, further comprising:
    a comparator circuit output resetting circuit that resets an output of said comparator circuit when said comparator is inactive.

11. The semiconductor memory device as claimed in claim 1, further comprising:
    a bit-line equalizing circuit that resets potentials of said bit lines and said dummy bit line to a predetermined voltage, wherein
    said comparator circuit becomes inactive when said bit-line equalizing circuit is active, and said comparator circuit becomes active when said bit-line equalizing circuit is inactive.

12. The semiconductor memory device as claimed in claim 1, further comprising:
    a dummy load capacitance provided in a wiring route from said bit-line equalizing circuit to said comparator circuit.

13. The semiconductor memory device as claimed in claim 1, further comprising:
    a data bus equalizing circuit resetting potentials of data buses or dummy data buses to a predetermined voltage, wherein
    said comparator circuit becomes inactive when said data bus equalizing circuit is active, and said comparator circuit becomes active when said data bus equalizing circuit is inactive.

14. The semiconductor memory device as claimed in claim 1, further comprising:
    a sense amplifier reading a data of a memory cell that is connected to a predetermined word line; and
    an output latch circuit latching an output of said sense amplifier.

15. The semiconductor memory device as claimed in claim 14, further comprising:
    a dummy sense amplifier provided in a wiring route from said bit-line equalizing circuit to said comparator circuit, and simulating a load of said sense amplifier; and
    a dummy output latch circuit simulating a load of said output latch circuit.

16. The semiconductor memory device as claimed in claim 1, further comprising:

a column switch selecting a predetermined bit line from among a plurality of bit lines, and connects the selected bit line to said sense amplifier, wherein said column switch makes said dummy bit line simulate the loads of a plurality of bit lines to be selected.

17. A semiconductor memory device comprising:

a memory cell array including a plurality of word lines, a plurality of bit lines, and a plurality of memory cells each provided at an intersection point of said word line and said bit line;

a word driver driving a predetermined word line in said memory cell array according to an address signal;

a dummy bit line simulating said bit line;

a reference voltage generating circuit generating a reference voltage;

a comparator circuit comparing a potential of said dummy bit line with the reference voltage;

a timing signal generating circuit generating various kinds of timing signals based on an output of said comparator circuit; and a plurality of dummy memory cells being simultaneously connectable to said dummy bit line.

18. The semiconductor memory device as claimed in claim 17, wherein said dummy memory cells are a plurality of reading dummy memory cells that are driven by a dummy word line.

19. The semiconductor memory device as claimed in claim 18, wherein a plurality of load dummy memory cells are connected to said dummy word line.

20. The semiconductor memory device as claimed in claim 17, wherein a plurality of load dummy memory cells are connected to said dummy bit line.

21. The semiconductor memory device as claimed in claim 17, wherein the number of said dummy memory cells that are connected simultaneously is adjusted on a layout.

22. The semiconductor memory device as claimed in claim 17, further comprising:

a switching circuit controlling the number of dummy memory cells that are connected simultaneously.

23. The semiconductor memory device as claimed in claim 17, further comprising:

a dummy memory cell selection signal generating circuit generating a dummy memory cell selection signal according to a dummy memory cell selection control signal; and a dummy memory cell selecting circuit selecting a plurality of dummy memory cells that are connected simultaneously according to the dummy memory cell selection signal.

24. The semiconductor memory device as claimed in claim 23, wherein said dummy memory cell selecting circuit is formed as a switch having a reset function.

25. The semiconductor memory device as claimed in claim 17, wherein said comparator circuit is a current-mirror type differential amplifier.

26. The semiconductor memory device as claimed in claim 17, further comprising:

a comparator circuit output resetting circuit that resets an output of said comparator circuit when said comparator is inactive.

27. The semiconductor memory device as claimed in claim 17, further comprising:

a bit-line equalizing circuit that resets potentials of said bit lines and said dummy bit line to a predetermined voltage, wherein said comparator circuit becomes inactive when said bit-line equalizing circuit is active, and said comparator circuit becomes active when said bit-line equalizing circuit is inactive.

28. The semiconductor memory device as claimed in claim 17, further comprising:

a dummy load capacitance provided in a wiring route from said bit-line equalizing circuit to said comparator circuit.

29. The semiconductor memory device as claimed in claim 17, further comprising:

a data bus equalizing circuit resetting potentials of data buses or dummy data buses to a predetermined voltage, wherein said comparator circuit becomes inactive when said data bus equalizing circuit is active, and said comparator circuit becomes active when said data bus equalizing circuit is inactive.

30. The semiconductor memory device as claimed in claim 17, further comprising:

a sense amplifier reading a data of a memory cell that is connected to a predetermined word line; and an output latch circuit latching an output of said sense amplifier.

31. The semiconductor memory device as claimed in claim 30, further comprising:

a dummy sense amplifier provided in a wiring route from said bit-line equalizing circuit to said comparator circuit, and simulating a load of said sense amplifier; and a dummy output latch circuit simulating a load of said output latch circuit.

32. The semiconductor memory device as claimed in claim 17, further comprising:

a column switch selecting a predetermined bit line from among a plurality of bit lines, and connects the selected bit line to said sense amplifier, wherein said column switch makes said dummy bit line simulate the loads of a plurality of bit lines to be selected.

* * * * *